(12) United States Patent
Sherwood et al.

(10) Patent No.: US 12,033,964 B2
(45) Date of Patent: Jul. 9, 2024

(54) CHEMICAL MECHANICAL POLISHING FOR COPPER DISHING CONTROL

(71) Applicant: Applied Materials, Inc., Santa Clara, CA (US)

(72) Inventors: Tyler Sherwood, Fonda, NY (US); Joseph F. Salfelder, Pleasant Valley, NY (US); Ki Cheol Ahn, Watervliet, NY (US); Kai Ma, Palo Alto, CA (US); Raghav Sreenivasan, Fremont, CA (US); Jason Appell, Malta, NY (US)

(73) Assignee: Applied Materials, Inc., Santa Clara, CA (US)

( * ) Notice: Subject to any disclaimer, the term of this patent is extended or adjusted under 35 U.S.C. 154(b) by 113 days.

(21) Appl. No.: 17/411,599

(22) Filed: Aug. 25, 2021

(65) Prior Publication Data
US 2023/0066610 A1  Mar. 2, 2023

(51) Int. Cl.
*H01L 23/00* (2006.01)
*H01L 21/306* (2006.01)
*H01L 21/321* (2006.01)
*H01L 21/768* (2006.01)

(52) U.S. Cl.
CPC ........ *H01L 24/03* (2013.01); *H01L 21/30625* (2013.01); *H01L 21/3212* (2013.01); *H01L 21/7684* (2013.01); *H01L 24/05* (2013.01); *H01L 24/27* (2013.01); *H01L 24/29* (2013.01); *H01L 2224/03616* (2013.01); *H01L 2224/05073* (2013.01); *H01L 2224/05647* (2013.01); *H01L 2224/27616* (2013.01); *H01L 2224/29186* (2013.01)

(58) Field of Classification Search
CPC .......... H01L 21/30625; H01L 21/3212; H01L 21/7684; H01L 2224/03616; H01L 2224/27616; H01L 2224/29147; H01L 24/05; H01L 24/29
See application file for complete search history.

(56) References Cited

U.S. PATENT DOCUMENTS

2004/0214442 A1*  10/2004  Lee ..................... H01L 21/3212
                                                                438/692
2005/0106872 A1*   5/2005  Hong ................ H01L 21/31053
                                                                438/692

(Continued)

*Primary Examiner* — Marcos D. Pizarro
(74) *Attorney, Agent, or Firm* — Kilpatrick Townsend & Stockton LLP

(57) ABSTRACT

Methods of semiconductor processing may include contacting a substrate with a first slurry and a first platen. The substrate may include silicon oxide defining one or more features, a liner extending across the silicon oxide and within the one or more features, and a copper-containing layer deposited on the liner and extending within the one or more features. The first slurry and the first platen may remove a first portion of the copper-containing layer. The methods may include contacting the substrate with a second slurry and a second platen, which may remove at least a portion of the liner. The methods may include contacting the substrate with a third slurry and a third platen, which may remove a second portion of the copper-containing layer. The methods may include contacting the substrate with a fourth slurry and a fourth platen, which may remove at least a portion of the silicon oxide.

20 Claims, 4 Drawing Sheets

(56) References Cited

U.S. PATENT DOCUMENTS

| | | | |
|---|---|---|---|
| 2006/0099807 A1* | 5/2006 | Jeong | H01L 21/7684 |
| | | | 257/E21.583 |
| 2014/0175655 A1* | 6/2014 | Chen | H01L 24/11 |
| | | | 228/172 |

* cited by examiner

CHEMICAL MECHANICAL POLISHING FOR COPPER DISHING CONTROL

TECHNICAL FIELD

The present technology relates to semiconductor systems, processes, and equipment. More specifically, the present technology relates to processes incorporated in chemical-mechanical polishing systems.

BACKGROUND

Chemical-mechanical polishing is commonly used in semiconductor processing to planarize or polish layers of material formed over a semiconductor substrate. In typical processing, a substrate is pressed against a rotating polishing pad on which a polishing slurry is flowed. Material formed along the substrate is removed through a combination of chemical interaction of the polishing slurry and mechanical interaction with the polishing pad. As processes increase in complexity, and non-uniformity of material formation on a substrate increases, standard chemical-mechanical polishing systems may be incapable of adequately responding to material structures to be polished.

Thus, there is a need for improved systems and methods that can be used to improve systems for increased polishing and removal precision. These and other needs are addressed by the present technology.

SUMMARY

Exemplary methods of semiconductor processing may include contacting a substrate with a first slurry and a first platen. The substrate may include silicon oxide defining one or more features, a liner extending across the silicon oxide and within the one or more features, and a copper-containing layer deposited on the liner and extending within the one or more features. The first slurry and the first platen may remove a first portion of the copper-containing layer. The methods may include contacting the substrate with a second slurry and a second platen. The second slurry and the second platen may remove at least a portion of the liner. The methods may include contacting the substrate with a third slurry and a third platen. The third slurry and the third platen may remove a second portion of the copper-containing layer. The methods may include contacting the substrate with a fourth slurry and a fourth platen. The fourth slurry and the fourth platen may remove at least a portion of the silicon oxide.

In some embodiments, the first slurry may be the same as the third slurry, and the first platen may be the same as the third platen. The second slurry may be the same as the fourth slurry, and the second platen may be the same as the fourth platen. Contacting the substrate with the fourth slurry and the fourth platen further may remove a third portion of the copper-containing layer. The copper-containing layer may be characterized by a concave profile within the one or more features in the silicon oxide. A nadir of the concave profile may be within 10 nm of a surface of the silicon oxide in which the one or more features are defined. Contacting the substrate with the fourth slurry and the fourth platen may continue for a period of time of greater than or about 10 seconds. The fourth slurry may be characterized by a removal selectivity between silicon oxide and copper of less than or about 2:1. The methods may also include diluting the second slurry to form the fourth slurry.

Some embodiments of the present technology may encompass semiconductor processing methods. The methods may include providing a substrate to a polishing assembly. The substrate may include silicon oxide defining one or more features recessed from a surface of the silicon oxide, a liner extending across the silicon oxide and within the one or more features, and a copper-containing layer deposited on the liner and extending within the one or more features. The methods may include polishing the substrate with a first slurry. Polishing with the first slurry may remove copper to expose the liner across the silicon oxide. The methods may include polishing the substrate with a second slurry. Polishing with the second slurry may remove the liner from the surface of the silicon oxide. The methods may include polishing the substrate with a third slurry. Polishing with the third slurry may recess the copper a distance within the features. The copper may be characterized by a dish profile having a dish depth. The methods may include polishing the substrate with a fourth slurry. Polishing with the fourth slurry may remove at least a portion of the silicon oxide and may reduce the dish depth of the copper.

In some embodiments, the first slurry is the same as the third slurry, and the second slurry is the same as the fourth slurry. The fourth slurry may be the second slurry diluted to a concentration of less than or about 40%. Polishing the substrate with the fourth slurry may etch silicon oxide at an etch rate of less than or about 15 nm per minute. Polishing the substrate with the fourth slurry may be performed for a period of time of greater than or about 30 seconds. The fourth slurry may be characterized by a removal selectivity between silicon oxide and copper of less than or about 1.5:1. The dish depth after polishing with the third slurry may be greater than or about 5 nm. The dish depth after polishing with the fourth slurry may be less than or about 5 nm.

Some embodiments of the present technology may encompass semiconductor processing methods. The methods may include providing a substrate to a polishing assembly. The substrate may include silicon oxide defining one or more features, a liner extending across the substrate and within the one or more features, and a copper-containing layer deposited on the liner and extending within the one or more features. The methods may include contacting the substrate with a first slurry and a first platen. The first slurry and the first platen may remove a first portion of the copper-containing layer. The methods may include contacting the substrate with a second slurry and a second platen. The second slurry and the second platen may remove at least a portion of the liner. The methods may include contacting the substrate with a third slurry and a third platen. The third slurry and the third platen may remove a second portion the copper-containing layer. The methods may include contacting the substrate with a fourth slurry and a fourth platen. The fourth slurry and the fourth platen may remove at least a portion of silicon oxide. The fourth slurry may be a dilution of the second slurry.

In some embodiments, the first slurry may be the same as the third slurry, the first platen may be the same as the third platen, and the second platen may be the same as the fourth platen. The fourth slurry may be characterized by a slurry concentration of less than or about 50% of the second slurry. Contacting the substrate with the fourth slurry and the fourth platen may continue for a period of time of greater than or about 30 seconds.

Such technology may provide numerous benefits over conventional systems and techniques. For example, the use of a four step polishing processes where the final slurry is a dilute version of a previously employed slurry may slow the etching of the material on a substrate such that a nadir or dish depth may be narrowly controlled. Additionally, method operations according to the present technology may afford tailored dishing in the copper-containing layer that may allow the resulting structure to be used in copper-to-copper hybrid bonding. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
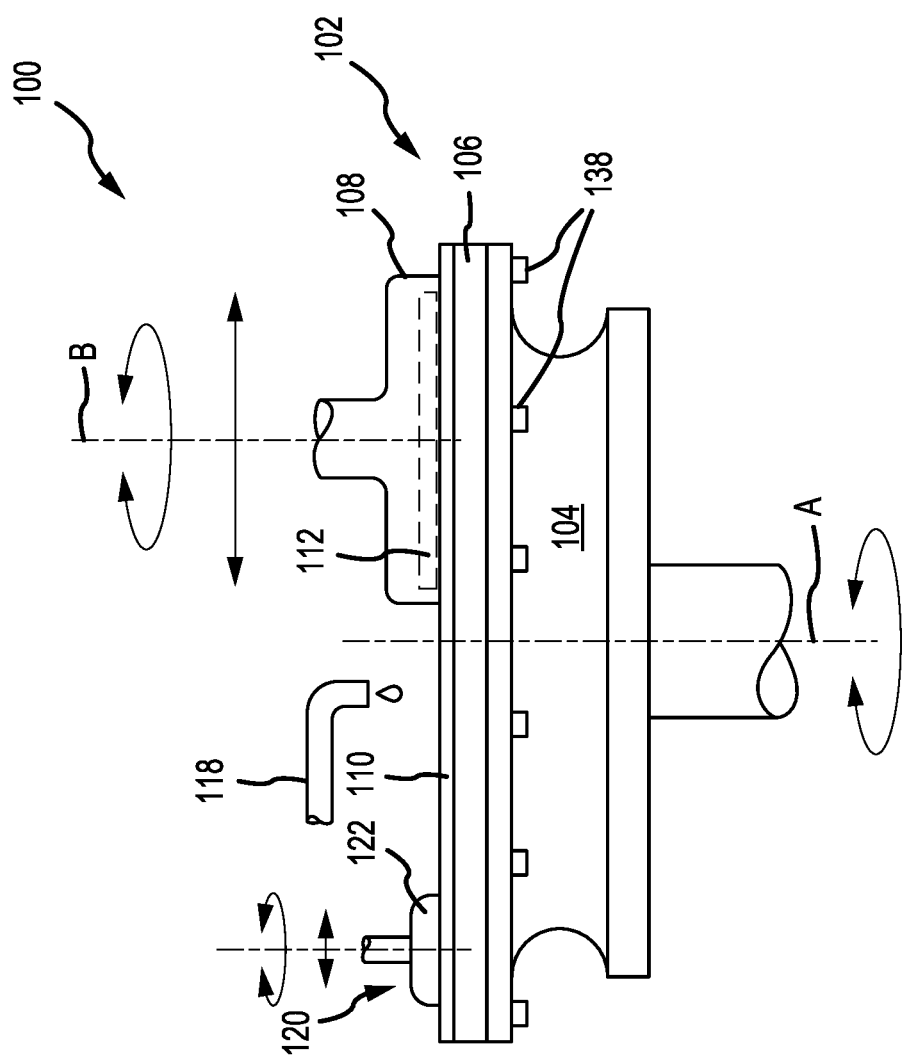
FIG. 1 shows a schematic cross-sectional view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Chemical-mechanical polishing often includes a multi-component system including a polishing assembly and a carrier head. A semiconductor substrate may be clamped into the carrier head, inverted, and depressed against a polishing pad on the polishing assembly. When non-uniform features or multiple films characterized by different physical properties are being removed, some systems may be able to modulate the pressure at which different zones of the substrate contact the polishing pad. For example, the carrier head may include chambers in which a pressure may be adjusted to increase or decrease a pressure applied to the substrate in that region. Similarly, a retaining ring extending outside of the substrate can be pressed with increased or decreased pressure to impact an overall effect on the substrate.

While these systems may provide a great degree of tuning to polishing operations, the systems may be limited in terms of certain fine-tune adjustments. For example, while a pressure may be applied to zones on the backside of the substrate, the chambers in the carrier head may often be circular or annular, and may only affect a specific radial zone about the substrate. Additionally, adjusting pressure on the backside of the substrate may afford less minute adjustments on polishing based on the need for the force to be applied through the thickness of the substrate. Conventional technologies may not be able to polish the semiconductor substrate as precisely to permit next generation bonding. While larger features filled with metal may overcome surface discrepancies to allow bonding between substrates by increased extrusion of metal, this may not provide adequate bonding for future generation products. For example, the pressure exerted during polishing may cause dishing of metal within features. Extruded studs in substrates to be connected may extend a certain distance past the substrate, which can accommodate a certain amount of dishing. However, as feature sizes and the incorporated metal reduce, the amount of expansion also may reduce, and these extensions may be incapable of properly connecting with dished metal in corresponding features. These systems may lead to significant inconsistencies in the amount of dishing or protrusion in the metal layer extending within one or more features on the semiconductor substrate. For example, conventional technologies may remove oxide and copper material too quickly and may result in the copper material being too dished, such as greater than or about 10 nm, for some applications of copper-to-copper hybrid bonding. This may extend too far from the dielectric surface, and prevent bonding with mating features.

Some applications of copper-to-copper hybrid bonding require that the dishing of the copper on the semiconductor substrate be precise such that the bonding is possible. For example, some copper-to-copper hybrid bonding applications require that the depth of the dish profile in the metal material be minimal and uniform, such as less than or about 5 nm. This depth may allow the dielectric material of both wafers having copper plugs to be contacted and interaction between the oxide material in the dielectric material may occur. Subsequent contacting the two wafers, the structure may be annealed. During annealing, the covalent bonds may form between the two distinct dielectric layers such that covalent bonding results. Also during annealing, the copper material may extrude and contact the other copper material. However, if dished copper extends too far within a feature, the extruded portion may not make adequate contact, and the electrical connection may not occur.

The present technology overcomes issues associated with conventional polishing systems by providing processes that allow fine-tuning of the polishing and, in turn, dishing. Using one or more slurries or one or more platens allows for fine-tuning of the polishing. Additionally, the one or more slurries or one or more platens may be used multiple times to control the mechanical and chemical actions during the polishing to planarize the semiconductor substrate in a preferred manner such that the semiconductor substrate is prepared for the formation of a circuit. For example, the semiconductor substrate may be contacted with multiple slurries that alternate selective removal between metal and dielectric materials. A final etching operation of dielectric material may utilize a dilute version of the dielectric-selective slurry, which may slow the removal of the oxide and copper material in the substrate, and which may allow for greater control of the final shape of the copper material. Because the processes use one or more slurries or one or more platens, such as a dilute version of a previously employed slurry, the polishing and removal of material from the semiconductor substrate can be configured such that a desirable final product is possible.

Although the remaining disclosure will routinely identify specific polishing processes utilizing the disclosed technology, it will be readily understood that the systems and methods are equally applicable to a variety of other chemical-mechanical polishing processes and systems. Accordingly, the technology should not be considered to be so limited as for use with the described polishing systems alone. The disclosure will discuss one possible system that can be used with the present technology before describing methods or operations of exemplary process sequences according to some embodiments of the present technology. It is to be understood that the technology is not limited to the equipment described, and processes discussed may be performed in any number of processing chambers and systems, along with any number of modifications.

FIG. 1 shows a schematic cross-sectional view of an exemplary polishing system 100 according to some embodiments of the present technology. Polishing system 100 includes a platen assembly 102, which includes a lower platen 104 and an upper platen 106. Lower platen 104 may define an interior volume or cavity through which connections can be made, as well as in which may be included end-point detection equipment or other sensors or devices, such as eddy current sensors, optical sensors, or other components for monitoring polishing operations or components. For example, and as described further below, fluid couplings may be formed with lines extending through the lower platen 104, and which may access upper platen 106 through a backside of the upper platen. Platen assembly 102 may include a polishing pad 110 mounted on a first surface of the upper platen. A substrate carrier 108, or carrier head, may be disposed above the polishing pad 110 and may face the polishing pad 110. The platen assembly 102 may be rotatable about an axis A, while the substrate carrier 108 may be rotatable about an axis B. The substrate carrier may also be configured to sweep back and forth from an inner radius to an outer radius along the platen assembly, which may, in part, reduce uneven wear of the surface of the polishing pad 110. The polishing system 100 may also include a fluid delivery arm 118 positioned above the polishing pad 110, and which may be used to deliver polishing fluids, such as a polishing slurry, onto the polishing pad 110. Additionally, a pad conditioning assembly 120 may be disposed above the polishing pad 110, and may face the polishing pad 110.

In some embodiments of performing a chemical-mechanical polishing process, the rotating and/or sweeping substrate carrier 108 may exert a downforce against a substrate 112, which is shown in phantom and may be disposed within or coupled with the substrate carrier. The downward force applied may depress a material surface of the substrate 112 against the polishing pad 110 as the polishing pad 110 rotates about a central axis of the platen assembly. The interaction of the substrate 112 against the polishing pad 110 may occur in the presence of one or more polishing fluids delivered by the fluid delivery arm 118. A typical polishing fluid may include a slurry formed of an aqueous solution in which abrasive particles may be suspended. Often, the polishing fluid contains a pH adjuster and other chemically active components, such as an oxidizing agent, which may enable chemical mechanical polishing of the material surface of the substrate 112.

The pad conditioning assembly 120 may be operated to apply a fixed abrasive conditioning disk 122 against the surface of the polishing pad 110, which may be rotated as previously noted. The conditioning disk may be operated against the pad prior to, subsequent, or during polishing of the substrate 112. Conditioning the polishing pad 110 with the conditioning disk 122 may maintain the polishing pad 110 in a desired condition by abrading, rejuvenating, and removing polish byproducts and other debris from the polishing surface of the polishing pad 110. Upper platen 106 may be disposed on a mounting surface of the lower platen 104, and may be coupled with the lower platen 104 using a plurality of fasteners 138, such as extending through an annular flange shaped portion of the lower platen 104.

The polishing platen assembly 102, and thus the upper platen 106, may be suitably sized for any desired polishing system, and may be sized for a substrate of any diameter, including 200 mm, 300 mm, 450 mm, or greater. For example, a polishing platen assembly configured to polish 300 mm diameter substrates, may be characterized by a diameter of more than about 300 mm, such as between about 500 mm and about 1000 mm, or more than about 500 mm. The platen may be adjusted in diameter to accommodate substrates characterized by a larger or smaller diameter, or for a polishing platen 106 sized for concurrent polishing of multiple substrates. The upper platen 106 may be characterized by a thickness of between about 20 mm and about 150 mm, and may be characterized by a thickness of less than or about 100 mm, such as less than or about 80 mm, less than or about 60 mm, less than or about 40 mm, or less. In some embodiments, a ratio of a diameter to a thickness of the polishing platen 106 may be greater than or about 3:1, greater than or about 5:1, greater than or about 10:1, greater than or about 15:1, greater than or about 20:1, greater than or about 25:1, greater than or about 30:1, greater than or about 40:1, greater than or about 50:1, or more.

The upper platen and/or the lower platen may be formed of a suitably rigid, light-weight, and polishing fluid corrosion-resistant material, such as aluminum, an aluminum alloy, or stainless steel, although any number of materials may be used. Polishing pad 110 may be formed of any number of materials, including polymeric materials, such as polyurethane, a polycarbonate, fluoropolymers, polytetrafluoroethylene polyphenylene sulfide, or combinations of any of these or other materials. Additional materials may be or include open or closed cell foamed polymers, elastomers, felt, impregnated felt, plastics, or any other materials that may be compatible with the processing chemistries. It is to be understood that polishing system 100 is included to provide suitable reference to components discussed below, which may be incorporated in system 100, although the description of polishing system 100 is not intended to limit the present technology in any way, as embodiments of the present technology may be incorporated in any number of polishing systems that may benefit from the components and/or capabilities as described further below.

Figure 2:
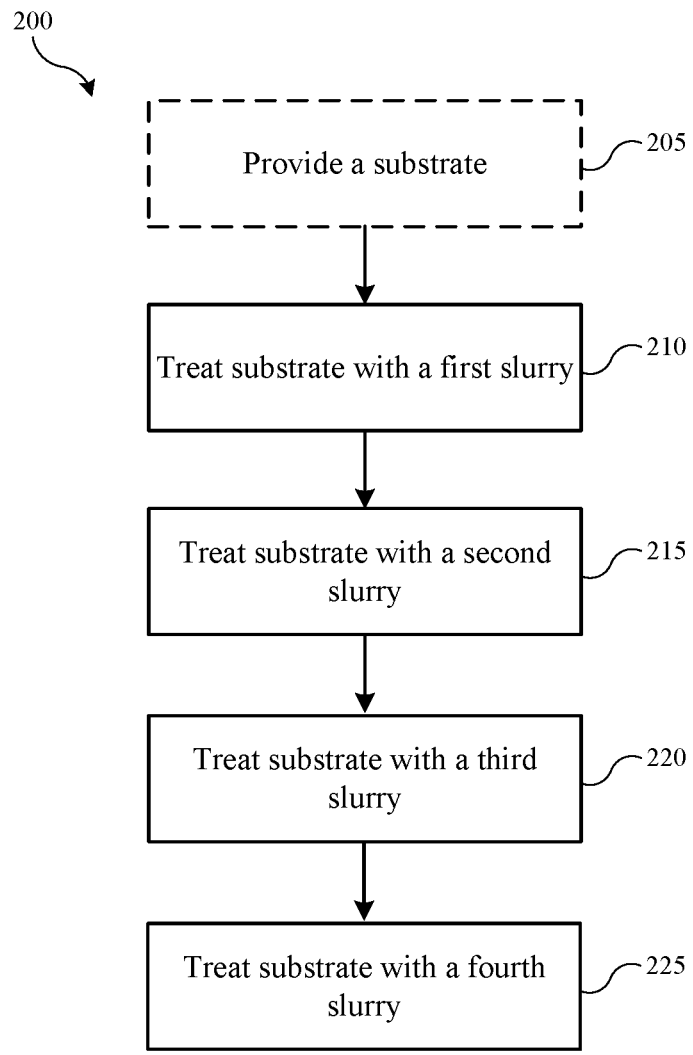
FIG. 2 shows operations in a semiconductor processing method according to some embodiments of the present technology.

Polishing assemblies explained above and according to embodiments of the present technology may be used in chemical-mechanical polishing operations. FIG. 2 shows exemplary operations in a processing method 200 according to some embodiments of the present technology. The method 200 may be performed in a variety of processing chambers, including the polishing system 100 described above, as well as any other chambers, in which the operations may be performed. Method 200 may include one or more operations prior to the initiation of the method 200, including front-end processing, deposition, etching, polishing, cleaning, or any other operations that may be performed prior to the described operations. The methods 200 may include a number of optional operations, which may or may not be specifically associated with some embodiments of methods according to embodiments of the present technology. Method 200 may describe operations shown schematically in FIGS. 3A-3E, the illustrations of which will be described in conjunction with the operations of method 200. It is to be understood that the figures illustrate only partial schematic views, and a substrate 305 may contain any number of additional materials and features having a variety of characteristics and aspects as illustrated in the figures.

Figure 3A:
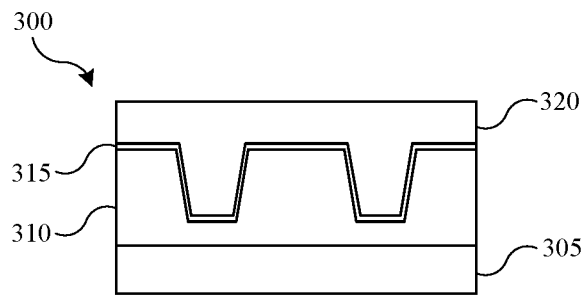
FIGS. 3A-E show exemplary schematic cross-sectional views of structures in which material layers are included and processed according to some embodiments of the present technology.

Method 200 may or may not involve optional operations to develop the semiconductor structure to a particular polishing operation, such as one or more semiconductor processing operations to develop one or more layers of material on a substrate and clamping a substrate to a carrier head of a polishing system 100. It is to be understood that method 200 may be performed on any number of semiconductor structures or substrates 305, as illustrated in FIG. 3A, including exemplary structure 300 on which silicon oxide 310, liner 315, and copper-containing layer 320 may be formed. Although the following description will regularly discuss silicon oxide, it is to be understood that any number of dielectric materials may be used in embodiments of the present technology, and the present technology should not be limited to any particular dielectric material in which features may be formed. As illustrated in FIG. 3A, the silicon oxide 310 may be processed to form one or more recesses or features, such as trenches, apertures or vias, or any other structure useful in semiconductor processing. Substrate 305 may be any number of materials, such as a base wafer or substrate 305 made of silicon or silicon-containing materials, or other substrate materials. For example, in some embodiments the substrate may be processed to include one or more materials or structures for semiconductor processing, such as the silicon oxide 310, liner 315, and copper-containing layer 320. Although only two features are shown in the figure, it is to be understood that exemplary structures may have any number of features defined along the structure according to embodiments of the present technology.

In some embodiments, method 200 may include providing a substrate 305 at optional operation 205 to a polishing assembly 100, such as the substrate 305 depicted in FIG. 3A. The substrate 305 may include silicon oxide 310 defining one or more features recessed from a surface of the silicon oxide 310, a liner 315 extending across the silicon oxide 310 and within the one or more features, and a copper-containing layer 320 deposited on the liner 315 and extending within the one or more features. In some embodiments, the liner 315 may be tantalum nitride, or any other suitable liner material incorporated to limit or prevent the potential for diffusion of metal into the dielectric material. As previously described, the silicon oxide 310, liner 315, and copper-containing layer 320 may be formed by any number of processing techniques that may be performed to develop a substrate and produce the structure described.

As will be described in greater detail below, during the polishing in method 200, the overall removal rate of metal, such as the copper-containing layer 320, may be greater than the removal rate of dielectric material, such as the silicon oxide 310, when utilizing the metal-selective slurry. Additionally, the dielectric-selective slurry may still cause an amount of removal of the metal, when exposed to the polishing pad and slurry. Further, the rate of removal in the copper-containing layer 320 may be greater towards the center of the copper in the one or more features as this copper may be a softer, bulk material. This greater rate of removal may result in a concave shape or dish shape forming in the copper during polishing. As previously explained, too much dishing may be considered a defect in polishing processing for copper-to-copper hybrid bonding applications. The concave shape or dish shape may feature a nadir or dish depth, respectively, that is the difference in height between the lowest point in the metal and the surface from which the feature is formed in the dielectric material, or a difference in edge height of the metal within the feature. If the nadir or dish depth is too great, the material may not be useful for certain end products. For example, copper-to-copper hybrid bonding is one such application that may be sensitive to an imprecise nadir or dish depth. In some applications of copper-to-copper hybrid bonding, if the nadir or dish depth is too great, the copper-to-copper bond may not be sufficiently strong due to limited contact with studs from mating features, or the coupling may not occur at all. In these applications substrate 305 having copper-containing layers 320 may be contacted by a secondary substrate for mating during back end of line process, and prior to an annealing operation. The dielectric material of each substrate 305, such as the silicon oxide 310, may contact the dielectric material of the other substrate such that the two separate substrates may bond into one structure. During the annealing operation, the dielectric materials may form oxide-to-oxide covalent bonds. The copper-containing layer 320 of the mating substrate may also extrude to contact the copper-containing layer 320 of the substrate 305. If the nadir or dish depth is too great, the copper-containing layer 320 may be too far recessed to connect with the copper stud during the annealing operation to contact the other copper-containing layer.

Figure 3B:
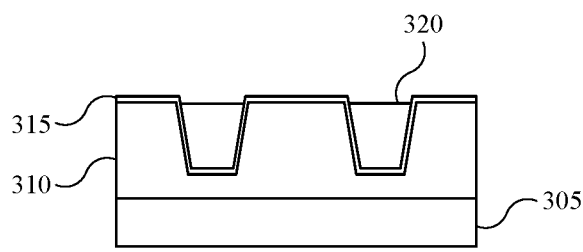

After providing the substrate 305 to the polishing assembly 100, the substrate 305 may be contacted with a first slurry at operation 210. As used throughout the disclosure, contact may be used interchangeably with polish, as contacting the substrate 305 with a slurry may result in a chemical operation that polishes the substrate 305. In some embodiments, at operation 210, the method 200 may include contacting the substrate 305 with a first platen in addition to the first slurry. Contacting the substrate 305 with the first slurry, and the first platen in some embodiments, may remove a first portion of the copper-containing layer 320. Operation 210 may remove the first portion of the copper-containing layer 320 such that the copper-containing layer 320 may be recessed below the liner 315, which may fully separate the regions of copper across the substrate 305, and ensure the metal does not connect discrete regions of copper across the substrate. Removing the first portion of the copper-containing layer 320 may isolate individual copper plugs within the copper-containing layer 320. The copper plugs may refer to the portions of the copper-containing layer 320 that extend into the one or more features. The first slurry may be selective to copper, and removing the copper-containing layer 320 may not remove a substantial amount of the liner 315. Therefore, operation 210 may remove the copper-containing layer 320 such that the liner 315 may be at least partially exposed and that the copper-containing layer 320 may be recessed to expose the liner 315 across a surface of the substrate and/or in the one or more features of the silicon oxide 310, as shown in FIG. 3B.

Figure 3C:
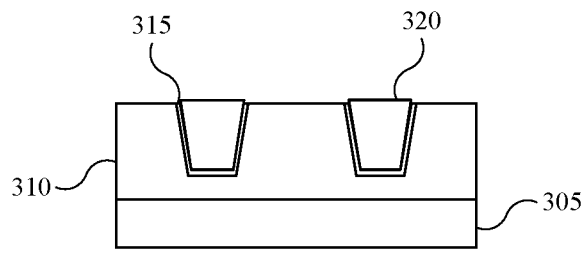

At operation 215, the substrate 305 may be contacted with a second slurry. In some embodiments, at operation 215, the method 200 may include contacting the substrate 305 with a second platen in addition to the second slurry. The second slurry, and the second platen in some embodiments, may remove at least a portion of the liner 315. The second slurry may be selective to removing the liner 315 and may not remove a substantial amount of the copper-containing layer 320. The second slurry may be selective to oxide and nitride materials, and may remove the liner and/or the oxide material at a rate that is greater than or about 1.5:1 compared to copper, and may be greater than or about 1.6:1, greater than or about 1.7:1, greater than or about 1.8:1, greater than or about 1.9:1, greater than or about 2.0:1, greater than or about 2.1:1, greater than or about 2.2:1, greater than or about 2.3:1, greater than or about 2.4:1, greater than or about 2.5:1, greater than or about 2.6:1, greater than or about 2.7:1, greater than or about 2.8:1, greater than or about 2.9:1, greater than or about 3.0:1, or more. The second slurry may remove the portion of the liner 315 that may be exposed after operation 210. That is, the portion of the liner 315 between the silicon oxide 310 and the first portion of the copper-containing layer 320, such as the portion of the copper-containing layer 320 that was removed in operation 210, may be removed during operation 215. As the portion of the liner 315 may be removed, the copper-containing layer 320 may protrude above the silicon oxide 310 based on the selectivity of removal, as shown in FIG. 3C.

Figure 3D:
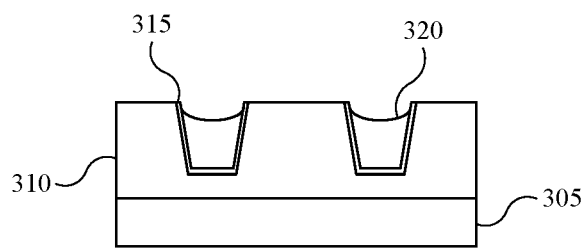

After the substrate 305 is contacted with the second slurry, the substrate 305 may be contacted with a third slurry at operation 220. In some embodiments, at operation 220, the method 200 may include contacting the substrate 305 with a third platen in addition to the third slurry. The third slurry, and the third platen in some embodiments, may remove at least a second portion of the copper-containing layer 320. The third slurry may be selective to removing the copper-containing layer 320 and may not remove a substantial amount of the silicon oxide 310. The third slurry may remove the second portion of the copper-containing layer 320 that may be exposed after operation 210 and operation 215. That is, the copper-containing layer 320 protruding above silicon oxide 310 may be removed during operation 220 such that the copper-containing layer 320 may be recessed below the silicon oxide 310, as shown in FIG. 3D. Operation 220 may be performed at a higher pressure than operation 210 or operation 215. This higher pressure may result in faster removal of softer, bulk copper in the middle of the one or more features of the substrate 305. This faster removal may result in dishing occurring in the copper-containing layer 320 as illustrated. In some embodiments, the third slurry may be the same as the first slurry. Additionally or alternatively, the third platen may be the same as the first platen.

During contacting of the substrate 305 with the third slurry, the copper-containing material 320 may be purposefully recessed below the silicon oxide 310. Purposefully recessing, or dishing, the copper-containing material 320 below suitable levels for copper-to-copper hybrid bonding may allow for a longer duration of operation 225, which may be preferred such that greater control may be exerted over the duration of operation 225. For example, if the copper-containing material 320 is only slightly recessed below the silicon oxide 310, the duration of operation 225 may be so short that greater dishing of the copper-containing material 320 than desirable may inadvertently occur, which may cause uniformity issues, or over etching of the materials. If the copper containing material 320 is over-recessed below the silicon oxide 310, operation 225 may take longer and may be a slower process, which may allow the final nadir or dish depth to be controlled to a finer degree.

After operation 220, the copper-containing layer 320 may be characterized by a concave profile within the one or more features in the silicon oxide 310. The copper-containing layer 320 may additionally or alternatively be characterized by a dish profile having a dish depth. A nadir of the concave profile, or a dish depth of the dish profile, after operation 220 may be greater than or about 5 nm within a surface of the silicon oxide 310, and may be greater than or about 6 nm, greater than or about 7 nm, greater than or about 8 nm, greater than or about 9 nm, greater than or about 10 nm, greater than or about 6 nm, greater than or about 11 nm, greater than or about 12 nm, greater than or about 13 nm, greater than or about 14 nm, greater than or about 15 nm, or higher.

A nadir or dish depth of greater than 5 nm may be too large for copper-to-copper hybrid bonding, for example. When the nadir or dish depth is greater than or about 5 nm or higher, subsequent annealing to bond the separate copper elements may not be effective as the copper may be too far apart. During annealing, the separate copper elements may extrude towards each other, but if the nadir or dish depth is too greater, the copper elements will not bond to each other. If the nadir or dish depth is too little, such that the copper protrudes from one or both of the substrates 305, the dielectric materials of the substrates 305 will not be able to bond to one another sufficiently. Further, temperature during annealing may be limited by other components on the substrate 305, such as gallium nitride, which may have a thermal limit of about 400° C. This thermal limit may prevent the annealing from occurring at a much higher temperature than of about 400° C. By performing the coupling at lower temperatures, the amount of thermal expansion may also be reduced, which may further limit copper expansion and coupling between the copper materials. Therefore, additional processing to fine-tune the nadir or dish depth of the copper-containing layer 320 may be necessary such that a copper-to-copper bond may form when separate copper elements of two substrates 305 are contacted.

Figure 3E:
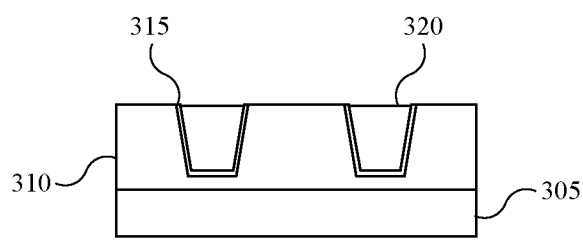

At operation 225, the substrate 305 may be contacted with a fourth slurry. In some embodiments, at operation 225, the method 200 may include contacting the substrate 305 with a fourth platen in addition to the fourth slurry. The fourth slurry, and the fourth platen in some embodiments, may remove at least a second portion of the silicon oxide 310. In some embodiments, the fourth slurry may be selective to removing the silicon oxide 310 and may not remove a substantial amount of the copper-containing layer 320. Contacting the substrate 305 with the fourth slurry and the fourth platen may further remove a third portion of the copper-containing layer 320. At operation 225, the copper-containing material 320 may be recessed such that the fourth slurry and the fourth platen may not immediately remove the copper-containing material 320. Instead, the fourth slurry and the fourth platen may remove only the silicon oxide 310 until the silicon oxide 310 is removed to a level near the copper-containing material 320. Once the silicon oxide 310 is removed to a level near the copper-containing material 320, the fourth slurry and the fourth platen may also remove the copper-containing material 320. The fourth slurry and the fourth platen may begin removing the copper-containing material 320 when the silicon oxide 310 is less than or about 2 nm higher than the copper-containing material 320, such as less than or about 1 nm. The fourth slurry may remove the silicon oxide 310 that may be extending above the copper-containing layer 320 after operation 220. That is, the silicon oxide 310 above copper-containing layer 320 may be removed during operation 225 such that the copper-containing layer 320 may be recessed below the silicon oxide 310 in a lesser amount than in operation 220, as shown in FIG. 3E. In some embodiments, the fourth slurry may be the same as the second slurry. Additionally or alternatively, the fourth platen may be the same as the second platen.

Contacting the substrate 305 with the fourth slurry, and in some embodiments the fourth platen, may continue for a period of time of greater than or about 10 seconds. When the period of time is greater than or about 10 seconds, this may allow processing to be finely tuned to remove a desirable amount of silicon oxide 310 such that the remaining nadir of the concave profile or dish depth of the dish profile of the copper-containing layer 320 may be precise. A precise nadir of the concave profile or dish depth of the dish profile, as further described below, may be necessary for further processing and applications of the semiconductor substrate.

In some embodiments, the method 200 may include diluting the second slurry to form the fourth slurry. Diluting the second slurry to form the fourth slurry may control the rate at which silicon oxide 310 is removed when the substrate 305 is contacted with the fourth slurry. The fourth slurry may be diluted previous to operation 225 or, alternatively, on-platen during operation 225. The fourth slurry may be characterized by a slurry concentration of less than or about 50% of the second slurry, and may be characterized by a slurry concentration of less than or about 47% of the second slurry, less than or about 45% of the second slurry, less than or about 43% of the second slurry, less than or about 40% of the second slurry, less than or about 37% of the second slurry, less than or about 35% of the second slurry, less than or about 33% of the second slurry, or lower. Similar to the removal selectivity between silicon oxide 310 and copper discussed above, the fourth slurry being a dilute version of the second slurry may provide that the fourth slurry removes silicon oxide 310 and copper-containing layer 320 at a rate such that the nadir of the concave profile or dish depth of the dish profile of the copper-containing layer 320 may be precise enough for subsequent copper-to-copper hybrid bonding.

Figure 4:
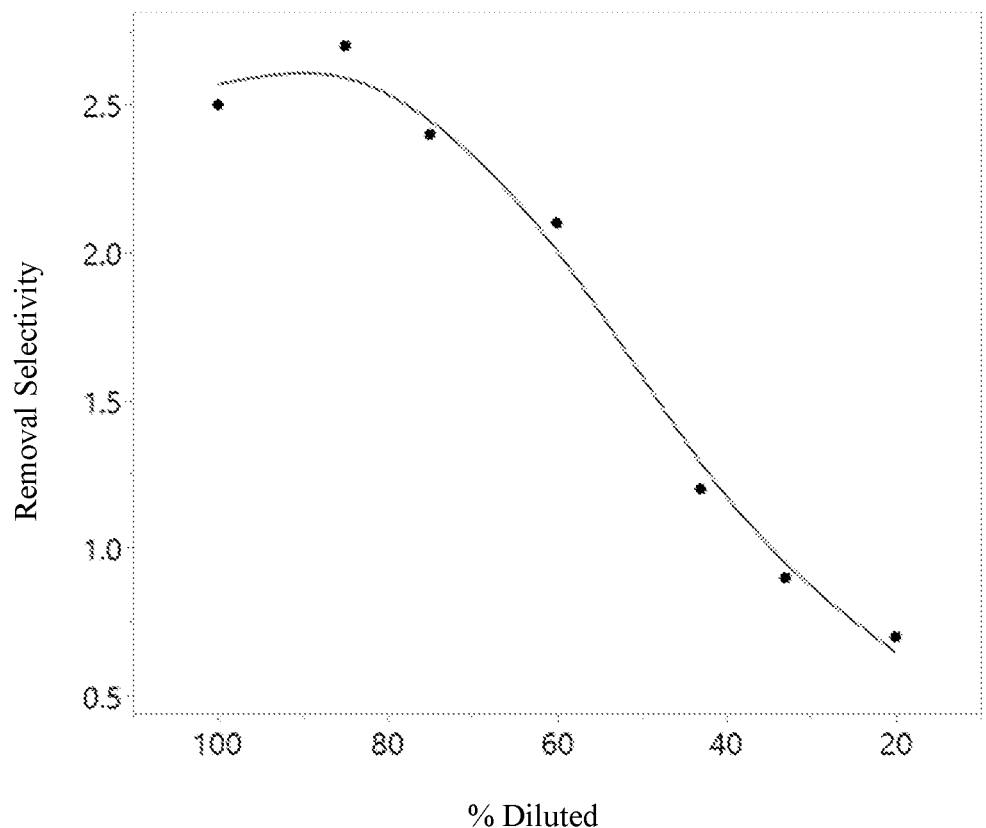
FIG. 4 shows a graphical depiction of a slurry selectivity to dielectric material versus copper compared to dilution of the slurry according to some embodiments of the present disclosure.

As shown in FIG. 4, diluting the fourth slurry may reduce a removal selectivity between silicon oxide 310 and copper. Diluting the fourth slurry may reduce a removal selectivity between silicon oxide 310 and copper of less than or about 2:1, and may produce a removal selectivity between silicon oxide 310 and copper of less than or about 1.9:1, less than or about 1.8:1, less than or about 1.7:1, less than or about 1.6:1, less than or about 1.5:1, less than or about 1.4:1, less than or about 1.3:1, less than or about 1.2:1, less than or about 1.1:1, less than or about 1.1:1, or lower. A removal selectivity between silicon oxide 310 and copper of less than or about 2:1 may provide that the fourth slurry removes silicon oxide 310 and copper-containing layer 320 at a sufficiently slow rate such that the removal operation may reduce the dishing of the copper by slowly removing the oxide and edge metal material. As shown in FIG. 4, the more dilute the fourth slurry is, the lower the removal selectivity may be. A removal selectivity between silicon oxide 310 and copper of less than or about 2:1 may provide that the fourth slurry removes silicon oxide 310 and copper-containing layer 320 at a rate such that the nadir of the concave profile or dish depth of the dish profile of the copper-containing layer 320 may be precise enough for subsequent copper-to-copper hybrid bonding.

Referring again to FIG. 2, during operation 225, contacting the substrate 305 with the fourth slurry may etch, or remove, silicon oxide 310 at an etch rate of less than or about 15 nm per minute. The etch rate may provide that the fourth slurry removes silicon oxide 310 at a rate slow enough to control the final nadir or dish depth of the copper-containing layer 320 such that the structure can be used in a variety of applications, such as copper-to-copper hybrid bonding. By slowing the removal of the silicon oxide 310, the removal of the copper-containing layer 320 may also be slowed. Slowing the removal of the copper-containing layer 320 may aid in reducing the nadir or dish depth in the copper-containing layer 320, such that the material may be used in copper-to-copper hybrid bonding. The etch rate may be less than or about 15 nm per minute, and may be less than or about 14 nm per minute, less than or about 13 nm per minute, less than or about 12 nm per minute, less than or about 11 nm per minute, less than or about 10 nm per minute, less than or about 9 nm per minute, less than or about 8 nm per minute, less than or about 7 nm per minute, less than or about 6 nm per minute, less than or about 5 nm per minute, less than or about 4 nm per minute, less than or about 3 nm per minute, less than or about 2 nm per minute, less than or about 1 nm per minute, or lower. Again, the etch rate of the silicon dioxide 310 of the embodiments of the present disclosure may allow for fine-tuning of the removal of silicon dioxide 310 and nadir or dish depth of the copper-containing layer 320 can be desirably controlled depending on the final application of the structure. By slowly etching the silicon oxide 310, the copper-containing layer 320 may also be more slowly etched. Etching the copper-containing layer 320 at a slower rate may allow the reduced nadir or dish depth, which may make the substrate 305 ideal for copper-to-copper hybrid bonding as explained in the present disclosure.

After operation 225, the copper-containing layer 320 may again be characterized by a concave profile or a dish profile within the one or more features in the silicon oxide 310. A nadir of the concave profile, or a dish depth of the dish profile, after operation 225 may be less than or about 5 nm within a surface of the silicon oxide 310, and may be less than or about 4 nm, less than or about 3 nm, less than or about 2 nm, less than or about 1 nm, less than or about 0.5 nm, or lower.

A nadir or dish depth of less than 5 nm may be small enough for copper-to-copper hybrid bonding, for example. When the nadir or dish depth is less than 5 nm or lower, subsequent annealing to bond the separate copper elements may be effective as the copper may be close enough to bond to each other during the annealing step. During the annealing step, the copper elements from separate substrates may extrude towards one another, may contact each other, and may bond. At reduced annealing temperatures according to some embodiments of the present technology, unless the dishing is sufficiently reduced, the amount of expansion may be insufficient to allow adequate coupling between the copper. By performing polishing operations according to the present technology, reduce dishing may be provided, which may improve coupling capability between substrates at reduced annealing temperatures.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a liner" includes a plurality of such liners and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a substrate to a polishing assembly, wherein the substrate comprises:
silicon oxide defining one or more features,
a liner extending across the substrate and within the one or more features, and
a copper-containing layer deposited on the liner and extending within the one or more features;
contacting the substrate with a first slurry and a first platen, wherein the first slurry and the first platen remove a first portion of the copper-containing layer such that a remaining portion of the copper-containing layer is recessed below the liner, which fully separates regions of copper within the one or more features across the substrate;
after contacting the substrate with the first slurry and the first platen, contacting the substrate with a second slurry and a second platen, wherein the second slurry and the second platen remove at least a portion of the liner;
after contacting the substrate with the second slurry and the second platen, contacting the substrate with a third slurry and a third platen, wherein the third slurry and the third platen remove a second portion the copper-containing layer; and
after contacting the substrate with the third slurry and the third platen, contacting the substrate with a fourth slurry and a fourth platen, wherein the fourth slurry and the fourth platen remove at least a portion of silicon oxide, and wherein the fourth slurry is a dilution of the second slurry.

2. The semiconductor processing method of claim 1, wherein:
the first slurry is the same as the third slurry;
the first platen is the same as the third platen; and
the second platen is the same as the fourth platen.

3. The semiconductor processing method of claim 1, wherein the fourth slurry is characterized by a slurry concentration of less than or about 50% of the second slurry.

4. The semiconductor processing method of claim 1, wherein contacting the substrate with the fourth slurry and the fourth platen continues for a period of time of greater than or about 30 seconds.

5. A semiconductor processing method comprising:
contacting a substrate with a first slurry and a first platen, wherein the substrate comprises:
silicon oxide defining one or more features,
a liner extending across the silicon oxide and within the one or more features, and
a copper-containing layer deposited on the liner and extending within the one or more features, wherein the first slurry and the first platen remove a first portion of the copper-containing layer such that a remaining portion of the copper-containing layer is recessed below the liner, which fully separates regions of copper within the one or more features across the substrate;
after contacting the substrate with the first slurry and the first platen, contacting the substrate with a second slurry and a second platen, wherein the second slurry and the second platen remove at least a portion of the liner;
after contacting the substrate with the second slurry and the second platen, contacting the substrate with a third slurry and a third platen, wherein the third slurry and the third platen remove a second portion of the copper-containing layer; and
after contacting the substrate with the third slurry and the third platen, contacting the substrate with a fourth slurry and a fourth platen, wherein the fourth slurry and the fourth platen remove at least a portion of the silicon oxide.

6. The semiconductor processing method of claim 5, wherein:
the first slurry is the same as the third slurry; and
the first platen is the same as the third platen.

7. The semiconductor processing method of claim 5, wherein:
the second slurry is the same as the fourth slurry; and
the second platen is the same as the fourth platen.

8. The semiconductor processing method of claim 5, wherein contacting the substrate with the fourth slurry and the fourth platen further removes a third portion of the copper-containing layer.

9. The semiconductor processing method of claim 5, wherein the copper-containing layer is characterized by a concave profile within the one or more features in the silicon oxide, and wherein a nadir of the concave profile is within 10 nm of a surface of the silicon oxide in which the one or more features are defined.

10. The semiconductor processing method of claim 5, wherein contacting the substrate with the fourth slurry and the fourth platen continues for a period of time of greater than or about 10 seconds.

11. The semiconductor processing method of claim 5, wherein the fourth slurry is characterized by a removal selectivity between silicon oxide and copper of less than or about 2:1.

12. The semiconductor processing method of claim 5, further comprising:
diluting the second slurry to form the fourth slurry.

13. The semiconductor processing method of claim 12, wherein the fourth slurry is characterized by a slurry concentration of less than or about 50% of the second slurry.

14. A semiconductor processing method comprising:
providing a substrate to a polishing assembly, wherein the substrate comprises:
silicon oxide defining one or more features recessed from a surface of the silicon oxide,
a liner extending across the silicon oxide and within the one or more features, and
a copper-containing layer deposited on the liner and extending within the one or more features;
polishing the substrate with a first slurry, wherein polishing with the first slurry removes copper to expose the liner across the silicon oxide;
polishing the substrate with a second slurry, wherein polishing with the second slurry removes the liner from the surface of the silicon oxide;
polishing the substrate with a third slurry, wherein polishing with the third slurry recesses the copper a distance within the features, and wherein the copper is characterized by a dish profile having a dish depth; and
polishing the substrate with a fourth slurry, wherein polishing with the fourth slurry removes at least a portion of the silicon oxide and reduces the dish depth of the copper.

15. The semiconductor processing method of claim 14, wherein:
the first slurry is the same as the third slurry; and
the second slurry is the same as the fourth slurry.

16. The semiconductor processing method of claim 14, wherein the fourth slurry is characterized by a removal selectivity between silicon oxide and copper of less than or about 1.5:1.

17. The semiconductor processing method of claim 14, wherein the dish depth after polishing with the third slurry is greater than or about 5 nm, and wherein the dish depth after polishing with the fourth slurry is less than or about 5 nm.

18. The semiconductor processing method of claim 14, wherein the fourth slurry comprises the second slurry diluted to a concentration of less than or about 40%.

19. The semiconductor processing method of claim 18, wherein polishing the substrate with the fourth slurry etches silicon oxide at an etch rate of less than or about 15 nm per minute.

20. The semiconductor processing method of claim 19, wherein polishing the substrate with the fourth slurry is performed for a period of time of greater than or about 30 seconds.

* * * * *